(12) United States Patent
Mancosu et al.

(10) Patent No.: US 7,415,874 B2
(45) Date of Patent: Aug. 26, 2008

(54) METHOD AND SYSTEM FOR GENERATING ELECTRICAL ENERGY WITHIN A VEHICLE TYRE

(75) Inventors: Federico Mancosu, Milan (IT); Barbara Rampana, Milan (IT); Fabio Mariani, Milan (IT); Andrea Calatroni, Milan (IT)

(73) Assignee: Pirelli Pneumatici S.p.A., Milan (IT)

( * ) Notice: Subject to any disclaimer, the term of this patent is extended or adjusted under 35 U.S.C. 154(b) by 0 days.

(21) Appl. No.: 10/584,849

(22) PCT Filed: Dec. 29, 2003

(86) PCT No.: PCT/IB03/06218

§ 371 (c)(1),
(2), (4) Date: Jun. 11, 2007

(87) PCT Pub. No.: WO2005/067073

PCT Pub. Date: Jul. 21, 2005

(65) Prior Publication Data

US 2007/0295069 A1 Dec. 27, 2007

(51) Int. Cl.
*G01M 17/02* (2006.01)
*H02N 2/18* (2006.01)

(52) U.S. Cl. ............... 73/146.5; 340/447; 340/445; 310/339

(58) Field of Classification Search ........... 73/146, 73/146.5; 340/445, 447; 310/339
See application file for complete search history.

(56) References Cited

U.S. PATENT DOCUMENTS 4,504,761 A * 3/1985 Triplett ............ 310/339
4,510,484 A    4/1985 Snyder
6,278,363 B1   8/2001 Bezek et al.

(Continued)

FOREIGN PATENT DOCUMENTS

EP    1 043 577    10/2000

(Continued)

*Primary Examiner*—Andre J Allen
(74) *Attorney, Agent, or Firm*—Finnegan, Henderson, Farabow, Garrett & Dunner, L.L.P.

(57) ABSTRACT

A tire has a piezoelectric flexing element associated with an energy storage device (e.g., a capacitor). The piezoelectric flexure element is mounted in cantilever fashion in a housing so as to be positioned substantially along a plane orthogonal to a radial direction of the tire and, so that a first end of the piezoelement is restrained by the housing. A loading mass is coupled to the second end of the piezoelectric flexure element. A small gap is formed between the inner walls of the housing and the outer surface of the loading mass in order to allow limited flexure of the piezo-electric element. The housing including the piezoelectric is mounted in a tire portion in correspondence of a tread area of the tire, preferably on the inner surface of the tire. The piezoelectric element flexes under the action of the radial acceleration when the tire rotates. The loading mass and the gap are chosen to obtain a) small entity oscillations of the flexure element substantially during a complete revolution of the tire when the tire rotates at low speed; b) large entity oscillations of the flexure element substantially only during the passage of the tire portion including the piezoelectric element in the contact patch. Sufficient electrical power for powering an electronic device included within the tire is obtained, together with a long durability of the piezoelectric element.

27 Claims, 12 Drawing Sheets

U.S. PATENT DOCUMENTS

| | | |
|---|---|---|
| 6,438,193 B1 | 8/2002 | Ko et al. |
| 6,992,423 B2 * | 1/2006 | Mancosu et al. ............ 310/339 |
| 7,096,727 B2 * | 8/2006 | Adamson et al. .............. 73/146 |
| 7,168,308 B2 * | 1/2007 | Mancosu et al. .............. 73/146 |
| 2003/0011276 A1 * | 1/2003 | Nowottnick ................. 310/311 |
| 2003/0146676 A1 * | 8/2003 | Mancosu et al. ............ 310/339 |
| 2005/0110277 A1 * | 5/2005 | Adamson et al. ............ 290/1 R |
| 2005/0285728 A1 * | 12/2005 | Tyndall ...................... 340/447 |
| 2006/0082258 A1 * | 4/2006 | Mancosu et al. ............ 310/339 |
| 2007/0063621 A1 * | 3/2007 | Haswell et al. ............. 310/339 |
| 2007/0205691 A1 * | 9/2007 | Hattori et al. ............... 310/311 |

FOREIGN PATENT DOCUMENTS

| | | |
|---|---|---|
| WO | WO 01/80327 | 10/2001 |
| WO | WO 03/095244 | 11/2003 |

* cited by examiner

METHOD AND SYSTEM FOR GENERATING ELECTRICAL ENERGY WITHIN A VEHICLE TYRE

CROSS REFERENCE TO RELATED APPLICATION

This application is a national phase application based on PCT/IB2003/006218, filed Dec. 29, 2003, the content of which is incorporated herein by reference.

BACKGROUND OF THE INVENTION

1. Field of the Invention

The present invention relates to a method and system for generating electrical energy within a vehicle tyre. More specifically, electrical power is generated by using piezoelectric technology to convert mechanical strain, due to tyre flexure during rolling, to electric charge, that is stored in an energy storage device, and is thus made available to an electronic device disposed within the tyre. The present invention also relates to a system for monitoring operating parameters of a tyre.

2. Description of the Related Art

The incorporation of electronic devices within pneumatic tyres is taking a greater importance in order to increase safety of vehicles. Tyre electronics may include sensors and other components suitable for obtaining information regarding various physical parameters of a tyre, such as for example temperature, pressure, number of tyre revolutions, vehicle speed. Such information may become useful in tyre monitoring and/or warning systems. Furthermore, active control systems of the vehicle may be based on information sent from sensor devices included within the tyres. Typically, wireless transmission is employed in order to send the tyre performance information outside the tyre, to a receiver disposed on the vehicle, so that such electronic devices disposed within the tyre typically include a transmitter associated to an antenna. A microprocessor is also typically employed, in order to collect and process the signals coming from the performance sensors, before transmission.

Such integrated tyre electronics have conventionally been powered by a variety of techniques and different power generation systems.

A typical solution for powering tyre electronics systems is the use of a non-rechargeable battery, which may cause inconveniences to a tyre user since proper electronics system operation is dependent on periodic battery replacement. As a matter of fact, batteries tend to deplete their energy storage quite rapidly when powering electronic applications characterized by complex levels of functionality. Furthermore, conventional batteries typically contain heavy metals that are not environmentally friendly and which present disposal concerns, especially when employed in numerous quantity. Moreover, performances of conventional batteries are often influenced by temperature: in particular, the functioning of such batters is not reliable at low temperatures.

Another known method for powering tyre monitoring systems is a coupling of radio-frequency (RF) power between an antenna disposed on the vehicle in close proximity with an antenna included within the electronic device disposed in the tyre. This typically requires antennas disposed in vehicle portions frequently exposed to damage from road hazards, and thus may not be a desirable solution for powering tyre electronic applications.

The use of piezoelectric elements has also been proposed for powering tyre monitoring systems. Piezoelectricity is a property of certain materials, such as quartz, Rochelle salt, and certain solid-solution ceramic materials such as lead zirconate-titanate (PZT), of generating electricity when mechanically stressed.

For example, PCT patent application WO 01/80327 A1 discloses a system for generating electrical energy in a vehicle tyre, comprising at least one elongate piezoelectric element which extends in a longitudinal direction along at least a portion of the tyre. The elongate piezoelectric element preferably comprises a coaxial cable extending along a straight or undulated path of the tyre circumference.

PCT patent application WO 03/095244 A1 discloses a system for generating electric power from a rotating tyre's mechanical energy that has a piezoelectric structure and an energy storage device. The structure comprises a plurality of piezoelectric fibers embedded in a generally unidirectional fashion in an epoxy matrix. The structure is mounted on a support substrate for uniformly distributing mechanical strain in the piezoelectric structure. The structure is mounted within a tyre for generating electric charge as the wheel moves along a ground surface.

U.S. Pat. No. 4,510,484 discloses a device provided for sensing the condition of a pneumatic tyre mounted on a tyre rim and subject to normal vibrations. The device comprises a housing, a band for mounting the housing to the tyre rim, a sensor for monitoring the condition within the tyre, circuitry operatively connected to the sensor for generating radio signals indicative of the tyre condition, power supply operatively connected to the circuitry and a receiver for receiving the radio signals. The power supply includes a radially extending piezoelectric reed having a base portion and an end portion. The base portion is elastomerically bonded to the housing. A tuning mass member is mounted to the end portion and is configured for mating abutment against stop members which limit the flexure stroke of the piezoelectric reed and inhibit the compound bending of the reed. The tuning mass member is sized relative to the piezoelectric reed to obtain a natural resonant frequency of vibration of the power supply of approximately 60 Hz, corresponding to common wheel vibrations which occur during vehicle operations. In operation, centrifugal forces operate to urge the tuning mass member away from the radiating center of the rotating wheel. Such forces tend to align the plane defined by the piezoelectric reed element with a radiating center line. In the event the reed element is not aligned at a rest equilibrium state with a radiating center line, centrifugal forces cause the reed element to bend into such an alignment and may urge the tuning mass member into continued engagement with an adjacent stop member. Such continued engagement would operate to reduce the vibration of the reed element and accordingly reduce the ability of the power supply to power the radio circuit. When the reed element is properly aligned along a radiating center line, the power supply may enjoy a maximum vibrational stroke during operation with optimum ability to power the radio circuit.

U.S. Pat. No. 6,438,193 discloses a self-powered revolution counter of a tyre, comprising a mechanical-electrical energy converter and a revolution counting circuit. One piezoelectric crystal element acts both as energy converter and as revolution sensor. The piezo element is attached to or embedded within the inner wall of the tyre, under the tread or the sidewall, in a way which causes it to flex with the tyre each time the circumferential sector of the tyre containing the piezo element is compressed against the road or other vehicle-supporting surface. A positive pulse is generated when the piezo element is flexed. When straightened again, the piezo element produces damped oscillating positive/negative signal at a significantly lower peak level than the positive pulse. The damped oscillations are determined by physical characteristics of the piezo element (mass, compliance). A typical measured oscillation frequency is on the order of 100 Hz. According to the authors, these oscillations are beneficial for enemy conversion. A prepared embodiment of the piezo element disclosed in the '193 patent is a circular unimorph having two circular plates bonded together and a piezo crystal plate in the center. According to the authors, the stress distribution is more uniform in this configuration than that obtained with a bimorph implemented in a typical cantilever mounting. The authors also disclose that an open voltage of 34 V was obtained with a large deflection in a tested cantilever-mounted bimorph piezo element. However, the Applicant notes that details related to the structure of the tested cantilever-mounted bimorph piezo element and to its mounting within the tyre are not disclosed in the '193 patent.

SUMMARY OF THE INVENTION

The Applicant has faced the problem of generating a sufficient power to be supplied to an electronic device, included within a tyre, adapted for monitoring at least one tyre parameter (e.g. pressure, temperature, number of tyre revolutions, traveled distance, rotational speed, acceleration), by mechanical-electrical energy conversion, exploiting piezoelectric effect. According to the Applicant, a structure of piezoelectric element suitable for obtaining this result should be of a cantilever-mounted flexure type, mounted in a portion of the tyre in correspondence of a tread area. However, another requirement for the piezoelectric element is durability. In other words, a structure comprising a cantilever-mounted flexure type piezoelectric element, mounted in a portion of a tyre in correspondence of a tread area, should also guarantee a resistance to early cracks and/or breakings that may be caused by the tremendous centrifugal force to which the piezoelectric element is subjected during rolling of the tyre, especially at high speed.

The Applicant has found that a sufficient power, together with a long durability, can be obtained by disposing a piezoelectric element in a cantilever-mounted fashion within a housing associated to a tyre, in a tyre portion in correspondence of a tread area thereof (e.g., attached to the inner surface of the tyre, substantially in correspondence of the equatorial plane thereof. The piezoelectric element carries a loading mass and a small gap is present between the inner walls of the housing and the outer surface of the loading mass. The housing is associated to the tyre so that the piezoelectric element is disposed along a plane substantially orthogonal to a radial direction of the tyre. The piezoelectric element, the loading mass and the small gap are sized so as to allow: a) oscillations of the piezoelectric element substantially during a complete revolution of the tyre, when the tyre rotates at low speed; b) oscillations of the piezoelectric element substantially only when the tyre portion including the piezoelectric element is in contact with the road, when the tyre rotates at high speed. In case b), in the fraction of tyre revolution in which the tyre portion including the piezoelectric element is not in contact with the road, the loading mass fixed to the piezoelectric element is urged against the inner walls of the housing by the centrifugal force developed by rotation of the tyre, so that the piezoelectric element is practically not subjected to deformation variations.

In other words, when the tyre rotates at low speed, a high quantity of electrical energy is generated by the oscillations of the piezoelectric element during a complete revolution of the tyre. The small gap and the rigidity of the piezoelectric element do not allow large deflections of the piezoelectric element, so that occurrence of cracks and/or breakings due to substantially continuous oscillation is reduced. When the tyre rotates at high speed, the high radial acceleration to which the piezoelectric element is subjected is counteracted by the contact with the inner walls of the housing for almost a complete revolution of the tyre, except during passage of the piezoelectric element in correspondence of the contact patch. This also reduces the occurrence of cracks and/or breakings in the piezoelectric material. However, energy is still generated due to substantially free oscillation of the piezoelectric element during the passage of the piezoelectric element in correspondence of the contact patch, where the radial acceleration is substantially null.

In a first aspect, the invention relates to a method for generating electrical energy within a tyre, the method comprising:

associating a housing including a piezoelectric element to a tyre portion in correspondence of a tyre tread area, the piezoelectric element being disposed substantially along a plane orthogonal to a radial direction of said tyre and having a first end substantially fixed to said housing and a second end fixed to a loading mass, a gap being formed between at least one inner wall of said housing and an outer surface of said loading mass;

rotating said tyre on a rolling surface at a first rotation speed lower than a given speed, so as to cause said loading mass to oscillate within said gap, thereby leading to a first deformation of said piezoelectric element during said tyre rotation;

rotating said tyre on said roiling surface at a second rotation speed higher than said given speed, so as to cause said loading mass to contact said inner wall during a first fraction of a complete tyre revolution, during said first fraction said tread area corresponding to said tyre portion being not in contact with the rolling surface, and to cause said loading mass to oscillate within said gap during a second fraction of a complete tyre revolution, during said second fraction said tread area corresponding to said tyre portion being in contact with the rolling surface, thereby leading to a second deformation of said piezoelectric element during said tyre rotation;

collecting electrical energy generated from said first and said second deformations of said piezoelectric element.

In a second aspect, the invention relates to a system for generating electrical energy comprising:

a tyre;

a power supply comprising a piezoelectric element, associated to a tyre portion in correspondence of a tyre tread area;

wherein said piezoelectric element is disposed within a housing so as to have a first end substantially fixed to said housing and a second end associated to a loading mass, a gap being formed between at least one inner wall of said housing and an outer surface of said loading mass;

said piezoelectric element is positioned substantially along a lane orthogonal to a radial direction of said tyre;

said piezoelectric element, said loading mass and said gap are sized so as to obtain:

a) during rotation of the tyre on a rolling surface at a first rotation sped lower than a given speed, an oscillation within said gap of said loading mass associated to said piezoelectric element b) during rotation of the tyre on said rolling surface at a second rotation speed higher than said given speed, a contact of said loading mass with said inner wall of said housing during a first fraction of a complete tyre revolution, during said first fraction said tread area corresponding to said tyre portion being not in contact with said rolling surface, and an oscillation within said gap of said loading mass associated to said piezoelectric element during a second fraction of a complete tyre revolution, during said second fraction said tread area corresponding to said tyre portion being in contact with the rolling surface.

In a third aspect, the invention relates to a system for monitoring at least one operating parameter of a tyre comprising:
- a system for generating electrical energy including a power supply according to the second aspect of the invention;
- a sensor device including a measurement device adapted to measure said at least one operating parameter and a transmitter device adapted to transmit said measured parameter, associated to said power supply;
- a receiving device adapted to receive said transmitted measured parameter.

BRIEF DESCRIPTION OF THE DRAWINGS

Further features and advantages of the present invention will be made apparent by the following detailed description of some exemplary embodiments thereof, provided merely by way of non-limitative examples, description that will be conducted by making reference to the attached drawings, wherein.

DETAILED DESCRIPTION OF THE INVENTION

Figure 1:
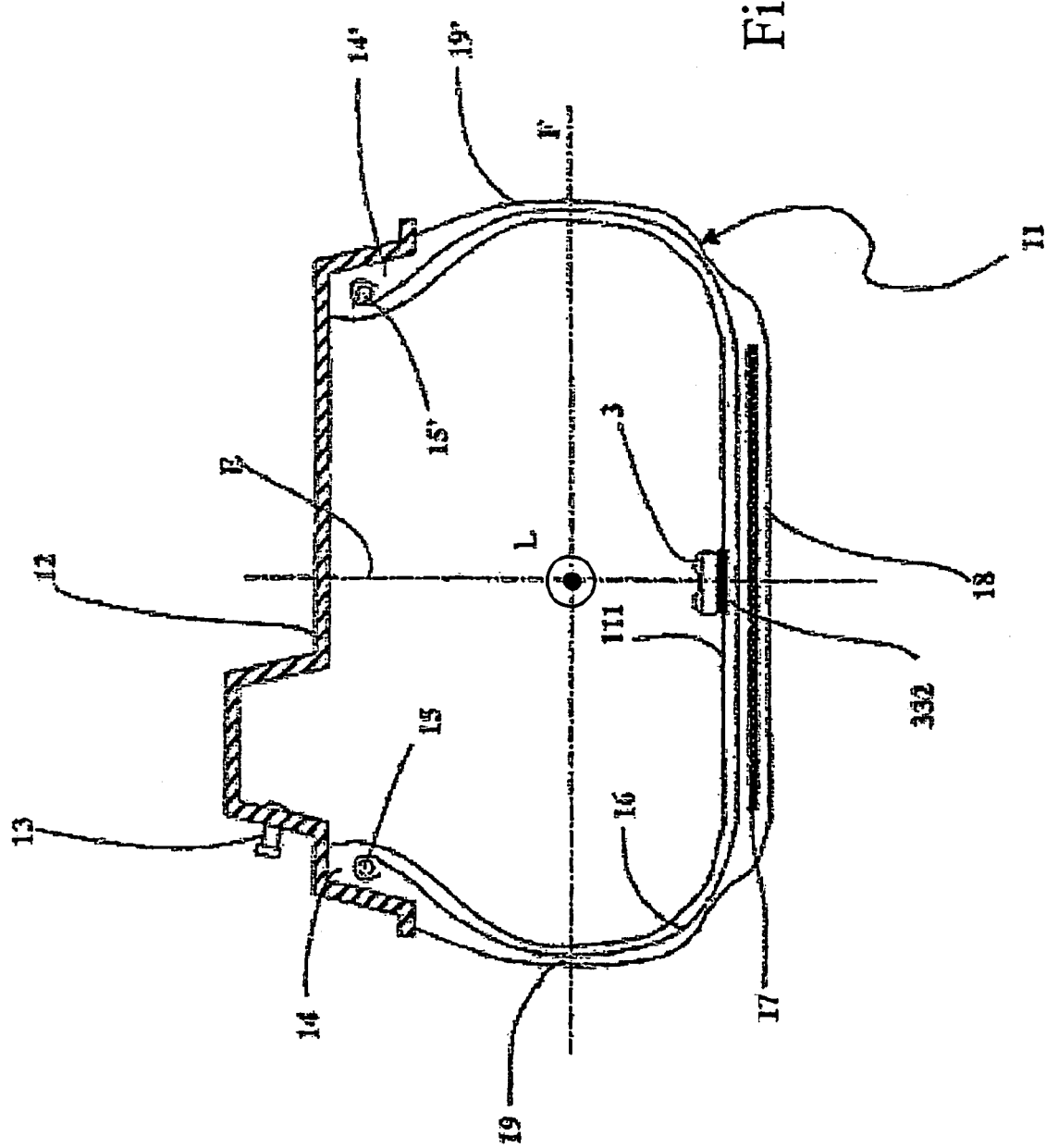
FIG. 1 shows a cross section of an exemplary tyre according to the invention.

FIG. 1 shows a cross section of a wheel comprising a tyre 11 and a supporting rim 12. The tyre 11 shown in FIG. 1 is of a type conventionally known as "tubeless", i.e. it does not include an inner tube. This tyre can be inflated by means of an inflation valve 13 positioned, for example, on the channel of the said rim 12.

The tyre 11 includes a carcass 16, terminating in two beads 14 and 14', each formed along an inner circumferential edge of the carcass 16, for fixing the tyre 11 to the corresponding supporting rim 12. The beads 14, 14' comprise respective reinforcing annular cores 15 and 15', known as bead cores. The carcass 16 is formed by at least one reinforcing ply, including textile or metallic cords, extending axially from one bead 14 to the other 14' in a toroidal profile, and having it ends associated with a respective bead core 15 and 15'. In tyres of the type known as radial, the aforesaid cords lie essentially in planes containing the axis of rotation of the tyre. An annular structure 17, known as belt structure, is placed in a radially external position with respect to the carcass 16. Typically, the belt structure 17 includes one or more strips of elastomeric material incorporating metal and/or textile cords, overlapping with each other. A tread band 18 of elastomeric material is wound around the belt structure 17 and impressed with a relief pattern for the rolling contact of the tyre with the ground. Two sidewalls 19 and 19' of elastomeric material, each extending radially outwards from the outer edge of the corresponding bead 14 and 14', are also placed on the carcass 16 in axially opposed lateral positions. In tubeless tyres the inner surface of the carcass 16 is normally covered with a liner 111, i.e. with one or more layers of air-impermeable elastomeric material. Other known elements, such as for example bead fillers may be provided, according to the specific design of the tyre 11.

A sensor device 3 is included within the tyre 11. The sensor device 3 is located in a tyre portion in correspondence of a tread area of the tyre 11, i.e. in a portion located in the region of the tyre 11 axially extending between the sidewalls of the tyre 11. Preferably, the sensor device is disposed substantially in correspondence of the equatorial plane of the tyre 11. In the preferred embodiment shown in FIG. 1, the sensor device 3 is secured to the inner liner 111 of the tyre 11. A fixing element 332 adheres both to the sensor device 3 and to the inner liner 111. The fixing element 332 provides the securing of the sensor device 3 to the inner liner 111 of the tyre, and is adapted to comply with the deformations undergone by the tyre structure during rolling, in order to stably maintain such sensor securing. Suitable materials for the fixing element 332 may include generally flexible rubbers, such as for example natural rubber, or synthetic rubber, e.g. rubbers made from conjugated dienes having from 4 to 10 carbon atoms such as polyisoprene, polybutadiene, styrene-butadiene rubber and the like. For improved adhesion between the sensor device 3 and the tyre 11, it may be advantageous to interpose a further adhesive element, for example a double-sided adhesive film, between the fixing element 332 and the inner surface of the tyre 11 and/or between the fixing element 332 and the sensor device 3. An appropriate double-sided adhesive film may be the Scotch® 300SL HI Strength, marketed by 3M. In alternative embodiments, the sensor device 3 may be incorporated within the structure of the tyre in the tyre portion corresponding to the tread area, for example within the tread band, or between the outer belt strip and the tread band.

Figure 2:
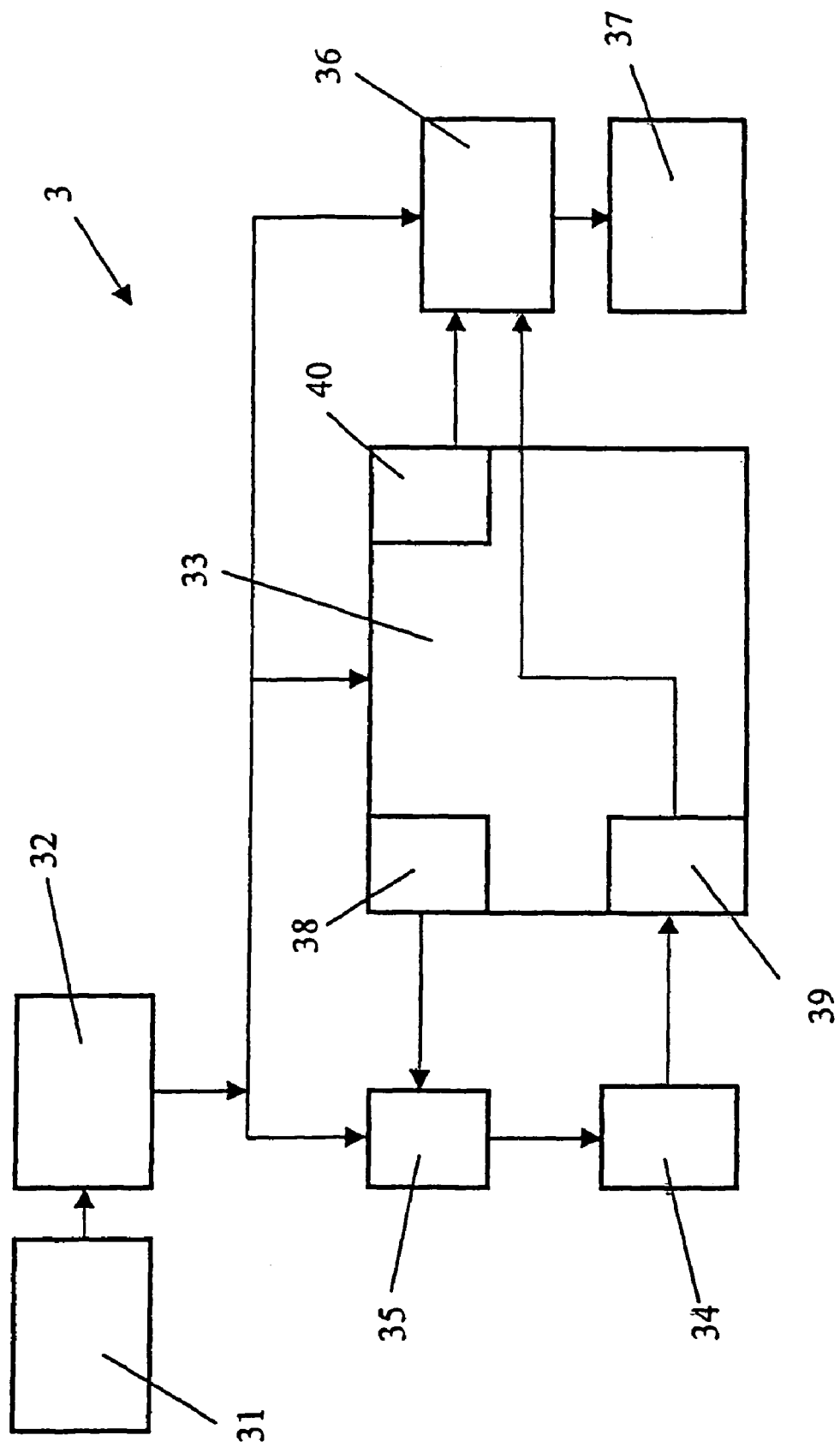
FIG. 2 shows an exemplary scheme of a sensor device to be included in the tyre of FIG. 1.

A scheme of an exemplary sensor device 3 is shown in FIG. 2. The sensor device 3 comprises a power supply 31, a microcontroller 33, a measurement device 34, a radio-frequency transmitter 36, an antenna 37. The power supply 31 comprises a flexing piezoelectric element, as it will be described in detail in the following, which deforms under the forces transmitted to it by the tyre during rolling on the road. Due to piezoelectric effect, such deformations generate electrical charge, which can be collected by suitable electrodes and fed to a voltage preparation circuit 32, typically including a diode rectifier bridge (not shown), being adapted to transform an alternate current in a direct current. The voltage preparation circuit 32 also includes a capacitor not shown), suitable for storing the electrical charge generated by piezoelectric effect. The voltage preparation circuit 32 may also comprise a voltage controller (not shown), being adapted to verify that a voltage across the capacitor is above a predetermined minimum (e.g. 2.7 Volt). The electrical power generated by the power supply 31 and stored in the voltage preparation circuit 32 is fed to the micro-controller 33, to the measurement device 34 (via switch 35) and to the radio-frequency transmitter 36. The measurement device 34 comprises sensors adapted to measure the tyre parameter or parameters to be monitored, such as for example pressure and/or temperature. The measurement device 34 also includes control circuitry adapted to transform the sensed parameters in electrical signals. The radio-frequency device 36 is adapted to transmit via the antenna 37, information frames containing the measured parameter or parameters, to a receiver (not shown) external to the tyre, typically located on the vehicle to which the tyre is fit. The microcontroller 33 typically comprises a CPU that controls operation of the sensor device 3. In the preferred embodiment shown in FIG. 2, the micro-controller 33 enables, via a first timing/enabling circuit 38, the switch 35 to close the circuit towards the measurement device 34, in order to energize the same for carrying out the measurement of the characteristic parameter or parameters to be monitored. Furthermore, the micro-controller 33 enables, via a second timing/enabling circuit 40, the transmission of the frames to the external receiver. Moreover, the mid controller 33 collects the signals coming from the measurement device 34, converts them, via an analog/digital converter 39, in a digital form, and processes them in order to extract the information to be sent outside the tyre via the radio-frequency transmitter 36. The enabling of the closure of the switch 35, as well as the enabling of the frame transmission by transmitter 36, may be performed at predetermined time intervals. For example, the first timing/enabling circuit 38 may drive the closure of the switch 38 every two minutes, whereas the second timing/enabling circuit 40 may enable transmission of collected data to the outside every seven minutes, since radio-frequency transmission typically requires more power with respect to parameter measurements. As another example, the closure of the switch 38 and/or the transmission of collected data may be enabled when the voltage across the capacitor included in the voltage preparation circuit 32 is above a predetermined threshold. The first and/or second timing/enabling circuits 38, 40 may be realized in any conventional manner, as hardware circuits separate from the micro-controller 33, or as software-objects integrated within the memory of the micro-controller 33.

Figure 3:
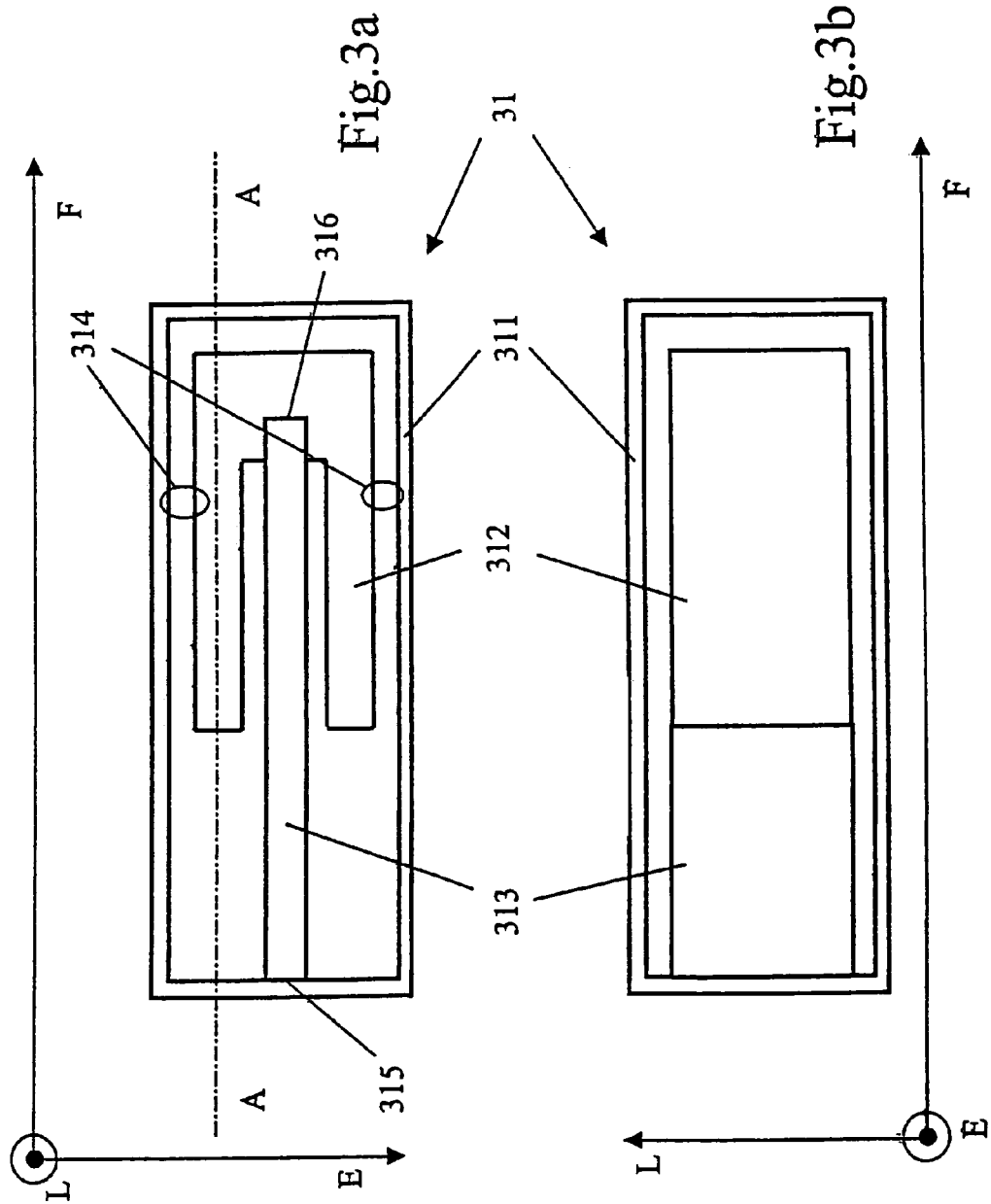
FIGS. 3a and 3b show an exemplary flexing piezoelectric element to be included in the sensor device of FIG. 2 for power supply.

FIG. 3a shows a lateral cross-section of the power supply 31. The power supply 31 comprises a housing 311, a piezoelectric element 313 and a loading mass 312 associated to the piezoelectric element FIG. 3b shows a view of the power supply along the section indicated as A-A in FIG. 3a. With reference to FIG. 3a, the piezoelectric element is disposed within the housing in cantilever-fashion. In other words, the piezoelectric element 313 is fixed at a first end 315 thereof to the housing 311, whereas the second end 316 is associated to the loading mass 312. The piezoelectric element is preferably formed as a planar element. Alternatively, it can be formed as a reed element, or as a bar element. In preferred embodiments, a planar piezoelectric element comprises at least two planar piezoelectric crystals, separated by a planar, electrically conductive (e.g., metallic) plate (bimorph configuration). Electrodes are conventionally disposed on the outer surfaces of the piezoelectric elements. The power supply 31 is associated to the tyre so as to dispose the piezoelectric element 313 along a plane substantially orthogonal to a radial direction of the tyre (indicated as "E" in FIG. 1, 3a, 3b), i.e., a direction radiating from the rotation axis of the tyre. In such way, the piezoelectric element 313 and the associated loading mass 312 are subjected, during rolling of the tyre, to the radial (i.e. centrifugal) acceleration. In order to uniformly distribute the stress undergone by the piezoelectric element 313, the longer side of the piezoelectric element 313 may be preferably disposed substantially according to an axial direction of the tyre (indicated as "F" in FIG. 1, 3a, 3b), i.e. a direction parallel to the rotation axis of the tyre. Alternatively, the longer side of the piezoelectric element may be disposed according to a longitudinal direction of the tyre (indicated as "L" in FIG. 1, 3a, 3b). The geometrical dimensions of the piezoelectric element 313, of the loading mass 312 and of the housing 311 are chosen so as to leave an interspace 314, also called "gap", between the outer surface of the loading mass 312 and the inner walls of the housing 311, that practically defines a maximum deflection allowed to the piezoelectric element 313. In order to limit the dimensions of the power supply 31 and to shift the center of mass of the piezoelectric element+loading mass structure substantially at the second end of the piezoelectric element 313, the loading mass 312 may preferably be U-shaped, as shown in FIG. 3a.

Figure 4:
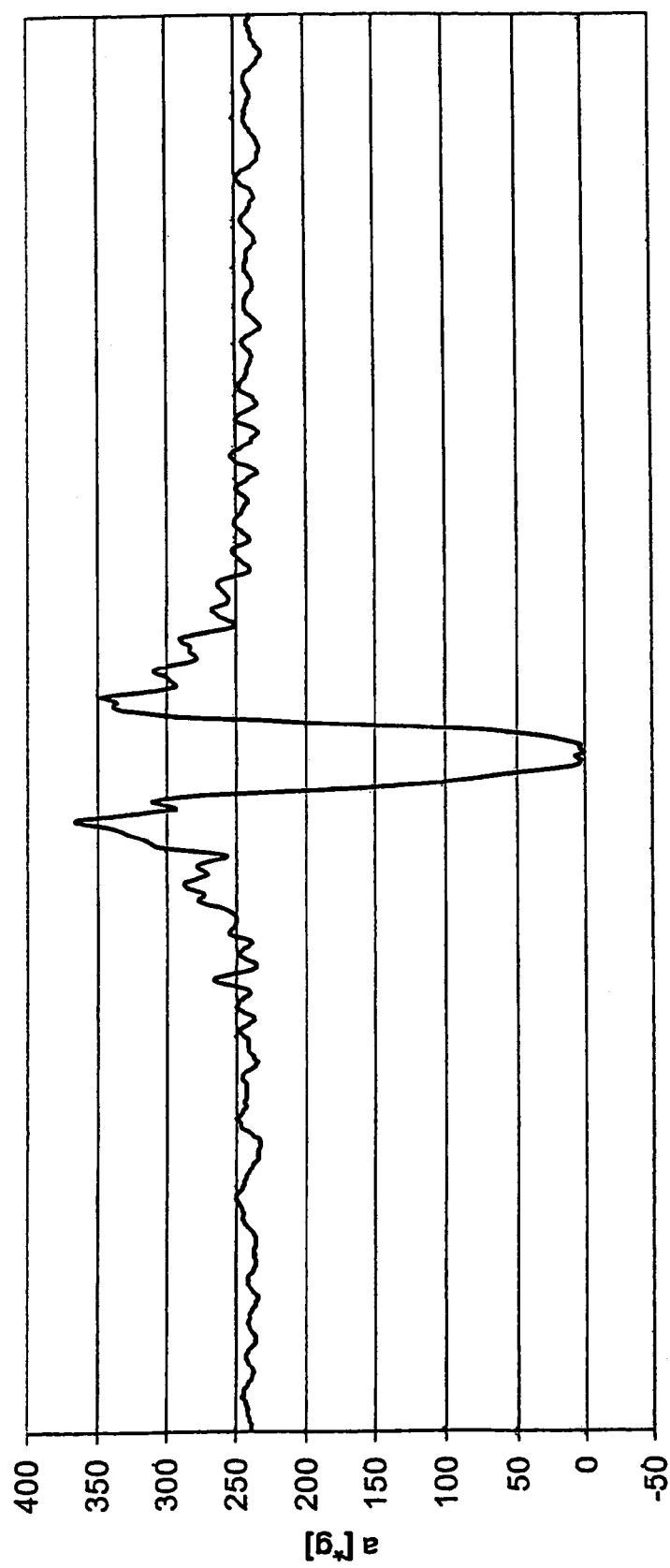
FIG. 4 shows a typical curve of radial acceleration versus time to which a portion of a tyre corresponding to a tread area is subjected during a complete tyre revolution.

In operation, the power supply 31 is subjected to the centrifugal acceleration which develops due to the tyre rotation. The centrifugal acceleration is mixed with other acceleration contributions that come from the interaction of the tyre with the ground during rolling. FIG. 4 shows an exemplary profile of a resulting radial acceleration versus time to which the tyre portion associated with the power supply 31 may be subjected during a tyre revolution.

During a first fraction of a complete tyre revolution, during which the tread area corresponding to the tyre portion associated with the power supply 31 is not in contact with the ground, the acceleration is substantially constant, except for the ripples visible in FIG. 4, the presence of which will be explained in the following, and assumes a value depending on the square of the tyre rotation speed. During a second fraction of a complete tyre revolution, during which the tread area corresponding to the tyre portion associated with the power supply 31 is in contact with the ground, the acceleration level drops to substantially zero, as it can be seen in the central portion of FIG. 4, after an initial increase due to a deformation to which the tyre is subjected during the passage from a circumferential to a flat configuration, at the very beginning of the contact region between tyre and ground. A further increase of the acceleration level is encountered when the tread area corresponding to the tyre portion associated with the power supply 31 exits from the contact region.

During the above mentioned first fraction of a complete tyre revolution, the power supply 31 can be subjected to a tremendous acceleration, that can reach values of several hundreds g at high speed (e.g. 360 g at 120 km/h). Subject to this acceleration, which is directed substantially along direction E in FIGS. 3a and 3b, the loading mass 312 is pushed away from a first equilibrium position, in which the piezoelectric element 313 is practically orthogonal to a radial direction of the tyre, towards the inner walls of the housing 311, to an extent that is dependent on the compliance characteristics of the piezoelectric element 313 and on the size of the loading mass 312, a maximum extent being defined by the gap 314. The movement of the loading mass 312 causes a corresponding flexing the piezoelectric element 313, i.e., generation of electric charge, due to piezoelectric effect. However, under this "static" acceleration, the generation of electric charge is suddenly interrupted as soon as the loading mass reaches and equilibrium position, that may be within the gap 314 or against the inner walls of the housing 311, depending on the acceleration value, i.e. on the tyre rotation speed. The more the rotation speed, the more the second equilibrium position is far from the first equilibrium position, up to a maximum defined by the gap 314, as said before.

On the other hand, during the above mentioned second fraction of a complete tyre revolution, i.e. during the passage in the contact region with the ground of the tread area corresponding to the tyre portion to which the power supply 31 is associated, the loading mass 312 is left free to oscillate around the first-equilibrium position, due to the fact that the acceleration drops to substantially zero, so that no force acts anymore to keep the loading mass 312 in the second equilibrium position. The oscillations of the loading mass 312 cause a corresponding flexing of the piezoelectric element 313, i.e. generation of electric charge, due to piezoelectric effect. These oscillations may furnish a high quantity of electric charge, in dependence of the extent of the oscillation and of the damping effect imposed from the damping characteristics of the piezoelectric element 313. However, as soon as the passage in the contact patch terminates, the centrifugal acceleration causes a forced stopping of the oscillations, with a positioning of the loading mass at the second equilibrium position, and a corresponding stopping of the generation of electric charge.

The total quantity of generated electric charge in the second fraction of a complete tyre revolution is the result of many effects, some of them counteracting with each other:

a) at low speed, the extent of the oscillation is quite low; however, every passage under the contact patch is quite long, so that a high number of oscillations (i.e. of deformations of the piezoelectric element 313) may be obtained, if the damping imposed by the piezoelectric element 313 is suitably chosen;

b) at high speed, the extent of the oscillation is higher, with a maximum defined by the gap 314; however, every passage under the contact patch has a lower duration with respect to case a) above, so that the number of oscillations is lower; notwithstanding, in a given time interval the number of passages under the contact patch is higher with respect to case a), so that a compensation may be obtained, counteracting the lower duration of each passage.

The behavior of the piezoelectric element 313 associated to the loading mass 312 explained hereinabove refers to a so-called "first harmonic" contribution of the acceleration to which the power supply 31 is subjected, i.e. a contribution that occurs once per tyre revolution. The frequency associated to such contribution may vary in a low frequency range from 0 Hz to few tens of Hz, depending on the tyre rotation speed (e.g. about 20-25 Hz, for a car tyre at a speed around 150 km/h), corresponding to the number of passages of the tyre portion associated to the power supply 31 under the contact patch in one second. Due to such low frequency contribution, a "pulsed" generation of electric charge may be obtained, as a result of the "pulsed" oscillating behavior of the piezoelectric element 313, with a "pulse frequency" depending on the tyre rotation speed.

However, the actual acceleration to which the power supply 31 is subjected in radial direction has also components in frequency ranges higher than those mentioned above, as it can be seen from the presence of the ripples exhibited by the radial acceleration profile shown in FIG. 4. These high frequency components are due to harmonic contributions of higher order, i.e. to events occurring more than once per tyre revolution. For example, a higher order harmonic contribution may be due to the interaction with the road of the blocks forming the tyre tread. Other higher order harmonic contributions may come from vibrational modes of the whole tyre structure due to the transmission of the deformations to which the tyre is subjected under the contact patch to tyre portions outside of the contact patch. Further high frequency contributions may be caused by the interaction of smaller tread portions with the road, that may depend on the granularity of the terrain (e.g. asphalt) on which the tyre is rolling.

Figure 5:
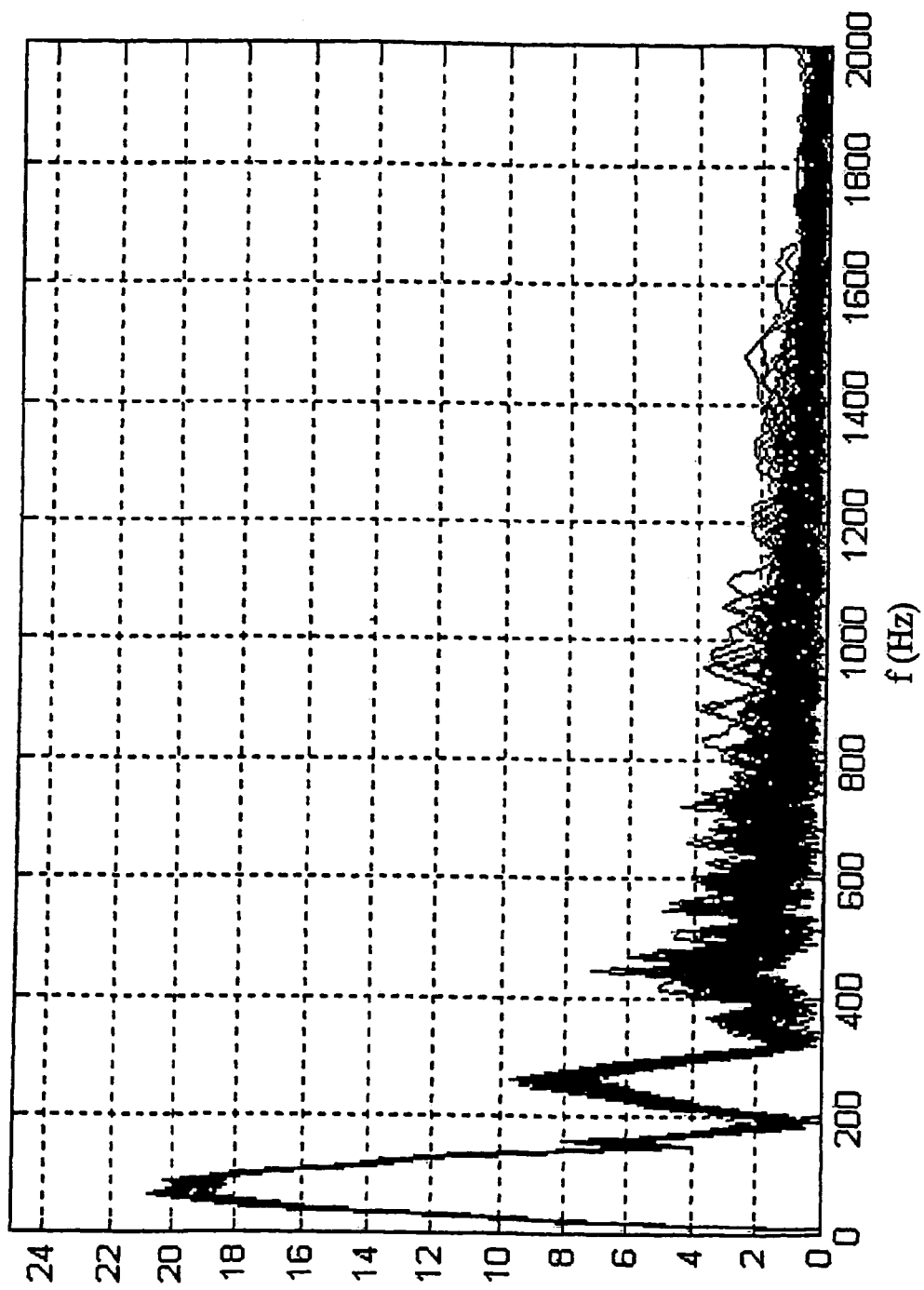
FIG. 5 shows a typical frequency spectrum of a radial acceleration curve such as that shown in FIG. 4.

Exemplarily, FIG. 5 shows the result of a Fourier transformation of a radial acceleration signal obtained by an accelerometer attached to the inner liner of a tyre (Pirelli P7 195/65 R15, inflated at 2.2 bar) rolling at a rotation speed of 80 km/h for several revolutions. FIG. 5 shows different superimposed curves, each one being related to the acceleration signal obtained in a single revolution. In abscissa, the frequency (in Hz) of the different acceleration components is reported, whereas in ordinate the sum of possible different contributions at be same frequency is reported (in arbitrary units). As it can be seen, a major contribution is obtained for frequencies up to about 200 Hz. The curves corresponding to the different tyre revolutions are well superimposed in this first frequency range, corresponding, according to the Applicant, to a behavior related practically only to the tyre structure, i.e. to the response of the tyre structure to the stress imposed by the rolling on the ground, and not to external factors (such as, for example, the kind of asphalt on which the tyre is rolling). At lower speed, the first frequency range has a lower width, and, correspondingly, the peak shown in FIG. 5 occurs at a lower frequency (e.g., about 50 Hz at 40 km/h). At higher frequencies, the contributions are lower and lower, and show a random behavior, represented by the increasing spreading of the different curves visible for frequencies higher than about 200-400 Hz, possibly due to rolling on different road conditions. Anyway, the different frequency components of the radial acceleration may give other contributions to the deformations of the piezoelectric element 313, further to the deformations obtained by the above mentioned first harmonic contributions.

Figure 6:
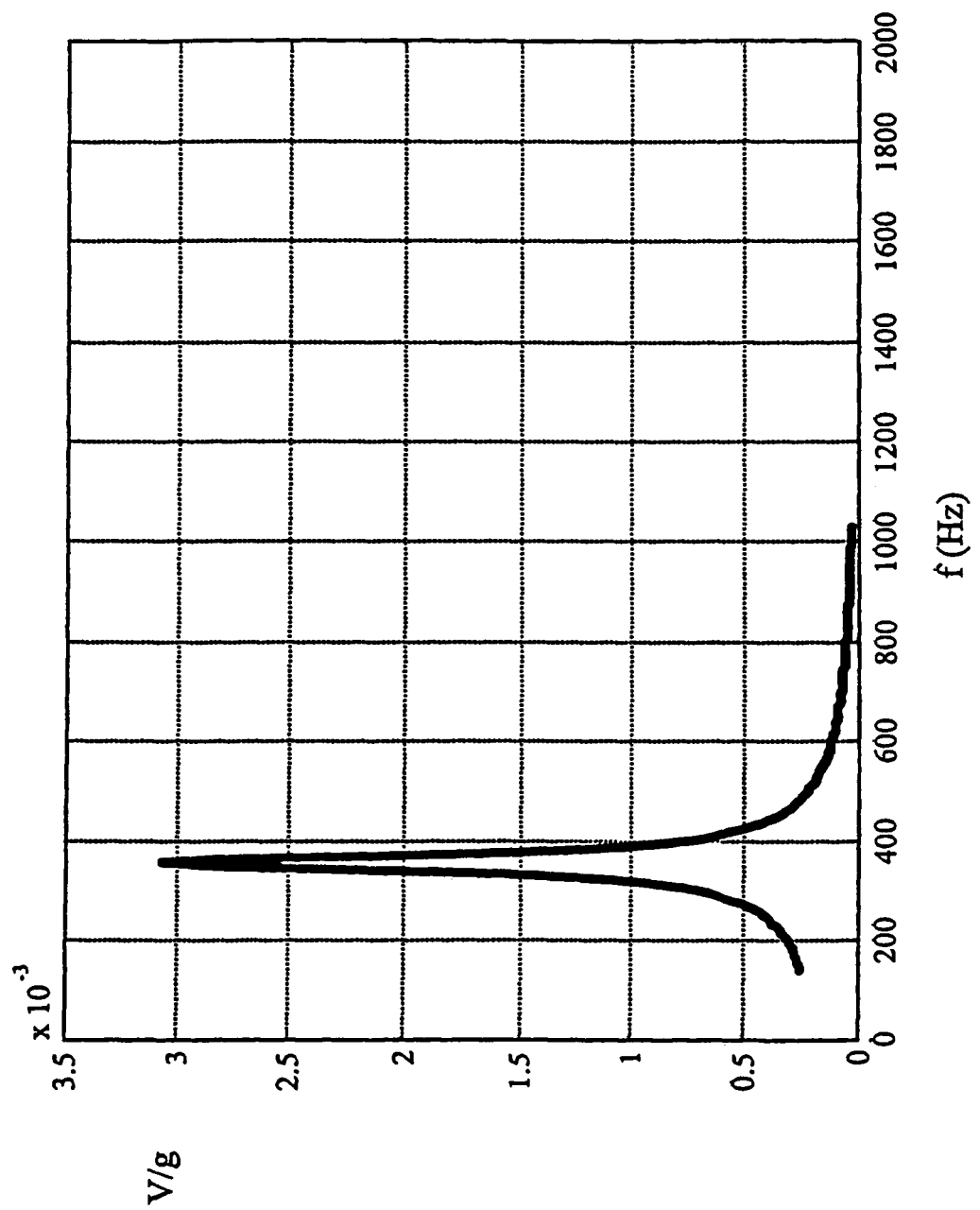
FIG. 6 shows an exemplary frequency response of the flexing piezoelectric element of FIG. 3.

By way of comparison, FIG. 6 shows the frequency response of an exemplary piezoelectric element 313 associated to a loading mass 312. The dimensions and material of the piezoelectric element 313 were chosen so as to obtain a stiffness k thereof of about 4800 N/m. The loading mass 312 m was sized to about 0.96 grams. In order to obtain the frequency response, the housing comprising the piezoelectric element associated to the loading mass was disposed on a shaker device driven by a control electronics, that applied a pulsed exciting force to the shaker, in a frequency range between 0 Hz and 1000 Hz. The movement of the shaker caused oscillations of the loading mass and of the piezoelectric element, with consequent generation of electric charge. FIG. 6 reports the transfer function voltage/acceleration (expressed in terms of g), versus the frequency the exciting force. As it can be seen from FIG. 6, a resonance peak of the structure formed by the piezoelectric element and by the loading mass is between 300 Hz and 400 Hz, i.e. quite far from the peak shown in FIG. 5. This means that, in practice, during rolling of the tyre the excitation force transmitted by the tyre to the power supply 31 comprising the cantilever-fashion piezoelectric element 313 cannot substantially cause resonant oscillation of the piezoelectric element 313. This fact is important in order to reduce the occurrence of cracks in the piezoelectric material, that could be caused by continuous large oscillations of the piezoelectric element 313, with consequent reduction of the efficiency of the power supply 31, or, in the worst cases, with early breaking of the piezoelectric element 313.

Even if not resonating, the piezoelectric element 313 is anyway excited by the components of the radial acceleration having frequency higher than the frequency of the "first harmonic". The Applicant has verified that when the tyre is rolling at low speed, i.e. when the centrifugal acceleration developed by the tyre rotation is not so strong to practically cancel out all the other frequency components of the radial acceleration, the loading mass 312 associated to the piezoelectric element 313 oscillates around the above mentioned second equilibrium position, i.e. the position reached by the loading mass when pushed by the centrifugal acceleration. Such oscillation, due to the "high frequency" components (i.e. components due to higher order harmonics and/or components due to interaction between tyre tread and road), is very beneficial for the generation of electric charge piezoelectric effect. Actually, due to such oscillations, a continuous flow of electric charge is generated during the above mentioned first fraction of a complete tyre revolution (i.e., the portion outside the contact patch), that, summed to the electric charge generated during the above mentioned second fraction of a complete tyre revolution (i.e. the contact patch), contributes to form a "continuous" generation of electric charge during the whole tyre revolution.

As said, such behavior occurs at low speed. At higher speed, the developed centrifugal acceleration becomes so strong, with respect to the other components forming the radial acceleration, that the loading mass 312 is urged against the inner walls of the housing 313 and any movement of the same is practically inhibited. In such situation, electric charge is, anyway, generated in the second fraction of tyre revolution.

Figure 7:
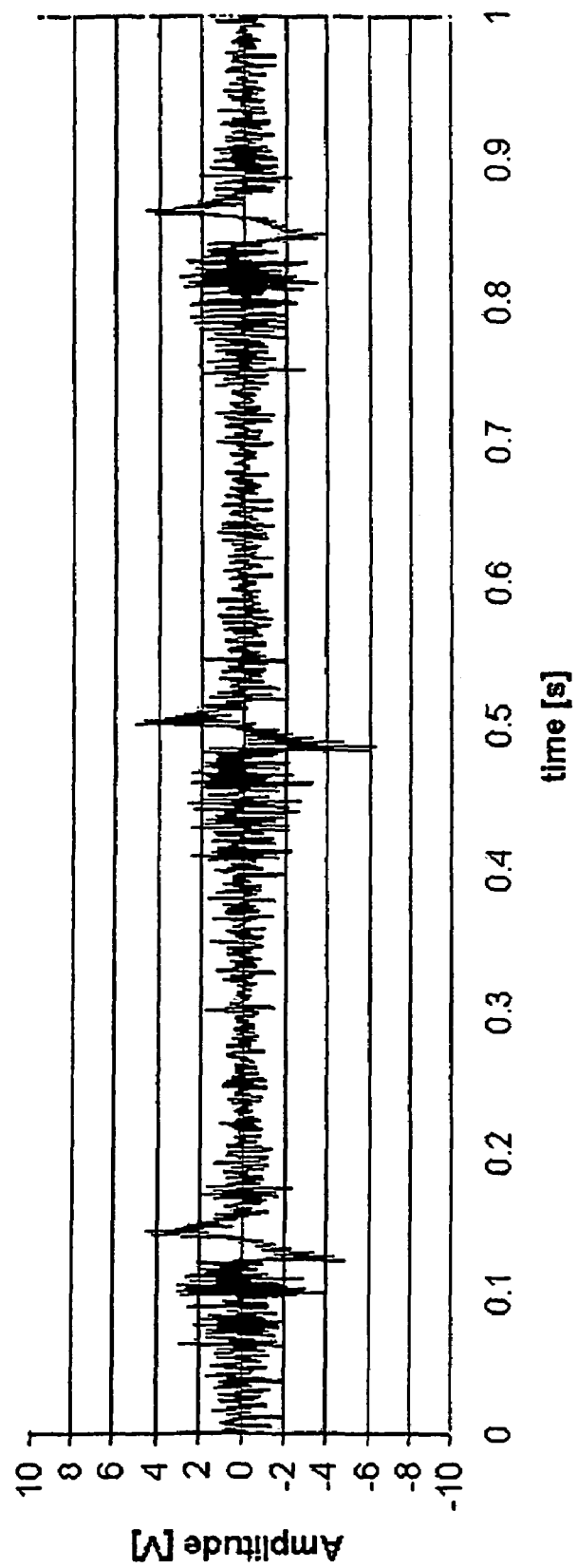
FIG. 7 shows a signal obtained from the flexing piezoelectric element of FIG. 3 mounted on a tyre rotating at a speed of 20 km/h.
Figure 8:
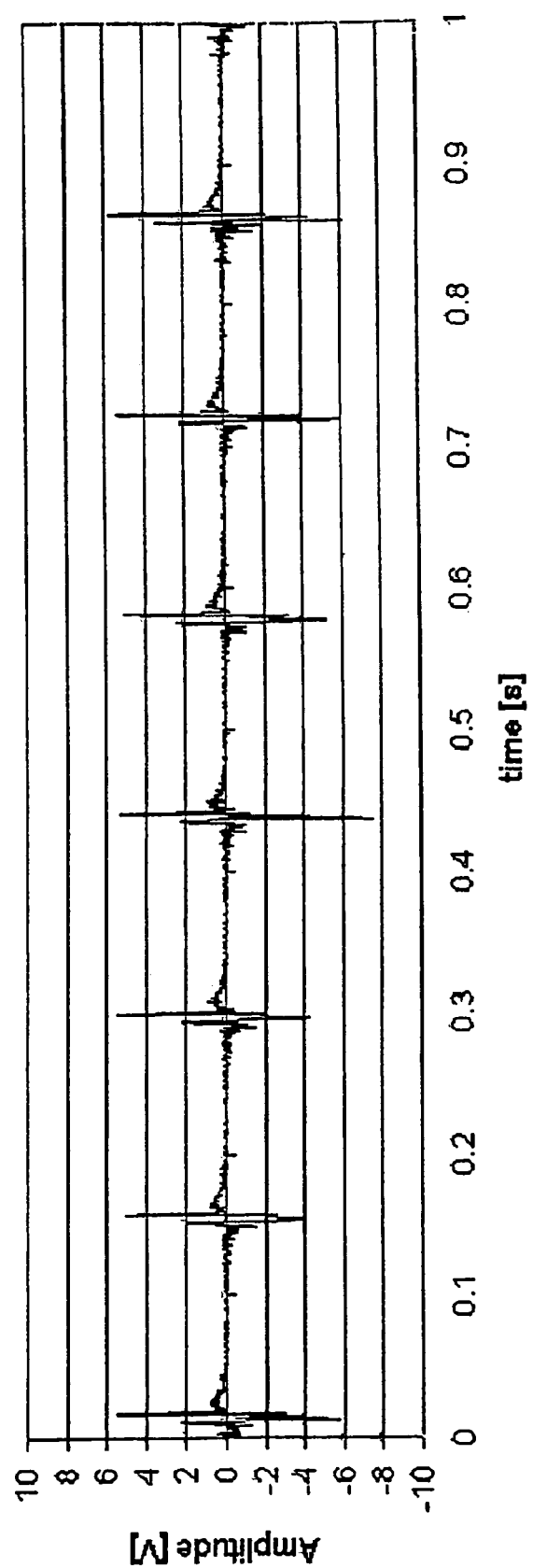
FIG. 8 shows a signal obtained from the flexing piezoelectric element of FIG. 3 mounted on a tyre rotating at a speed of 50 km/h.

FIG. 7 and FIG. 8 show this different behavior of the power supply 31. More particularly, both figures show the voltage versus time generated by a power supply attached with an elastomeric patch to the inner liner of a tyre, the power supply being formed by including a bimorph plate of piezoelectric material (PZT), having a width of 5 mm, a length of 11 mm, an overall thickness of 0.46 mm in a plastic housing having width of 7 mm, a length of 13 mm, a height of 7 mm, a thickness of 0.5 mm. A loading mass of 0.97 gr. was fixed to the free end of the piezoelectric plate. A gap of 250 µm was left in radial direction between the inner walls of the housing and the outside surface of the loading mass (125 µm+125 µm).

FIG. 7 shows the voltage versus time obtained by such power supply when the tyre rotated at 20 km/h. Three strong voltage oscillations are visible, corresponding to the passages of the tread area corresponding to the tyre portion associated to the power supply under the contact patch, with a superimposed continuum of smaller voltage oscillations extending across the whole time interval. Clearly, voltage oscillations are due to actual oscillations of the piezoelectric plate, that occur both when the tread area corresponding to the tyre portion associated to the power supply is outside the contact patch, and when the tread area corresponding to the tyre portion associated to the power supply is within the contact patch.

FIG. 8 shows the voltage versus time obtained by the power supply when the tyre rotated at 50 km/h. The number of strong voltage oscillations increases, due to the higher rotation speed. However, the smaller voltage oscillations have practically disappeared, so that the generated voltage signal is similar to a pulsed signal, with bursts separated from each other. In this second case, the electric charge is generated practically only when the tread area corresponding to the tyre portion associated to the power supply is within the contact patch.

Figure 9:
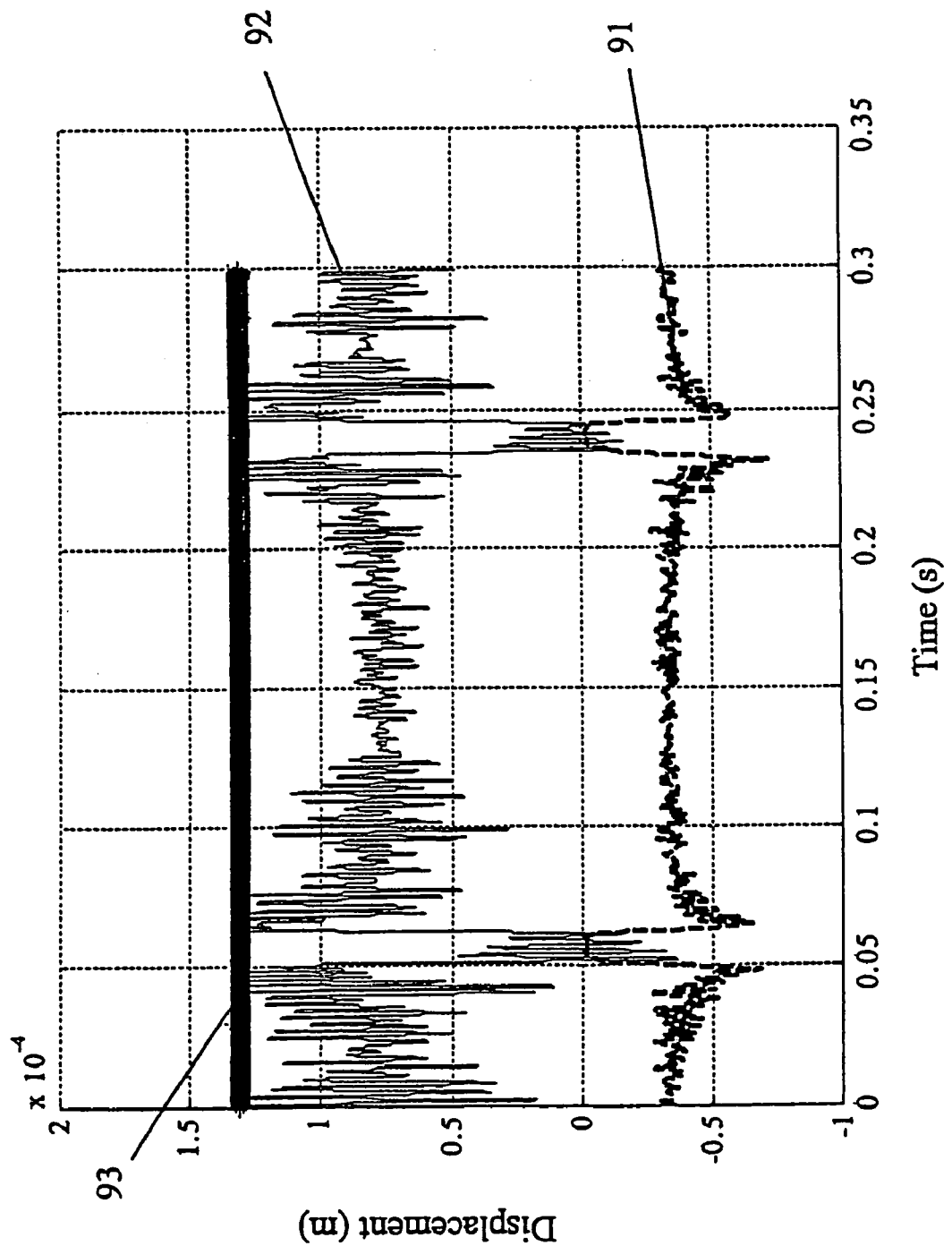
FIG. 9 shows the displacement versus time to which the loading mass fixed to flexing piezoelectric element of FIG. 3 is subjected during rotation of the tyre at low speed (40 km/h)
Figure 10:
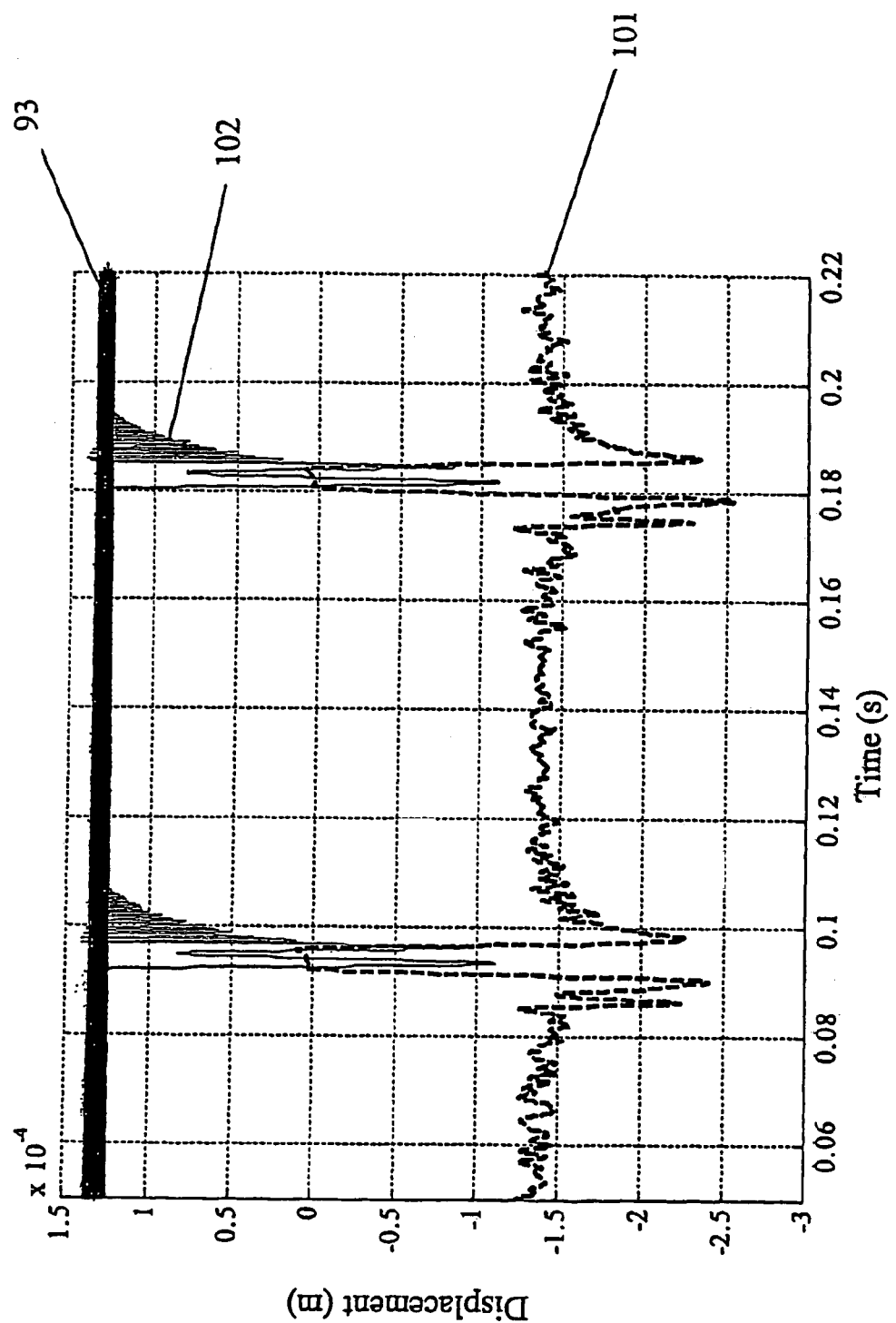
FIG. 10 shows the displacement versus time to which the loading mass fixed to flexing piezoelectric element of FIG. 3 is subjected during rotation of the tyre at high speed (80 km/h)
Figure 11:
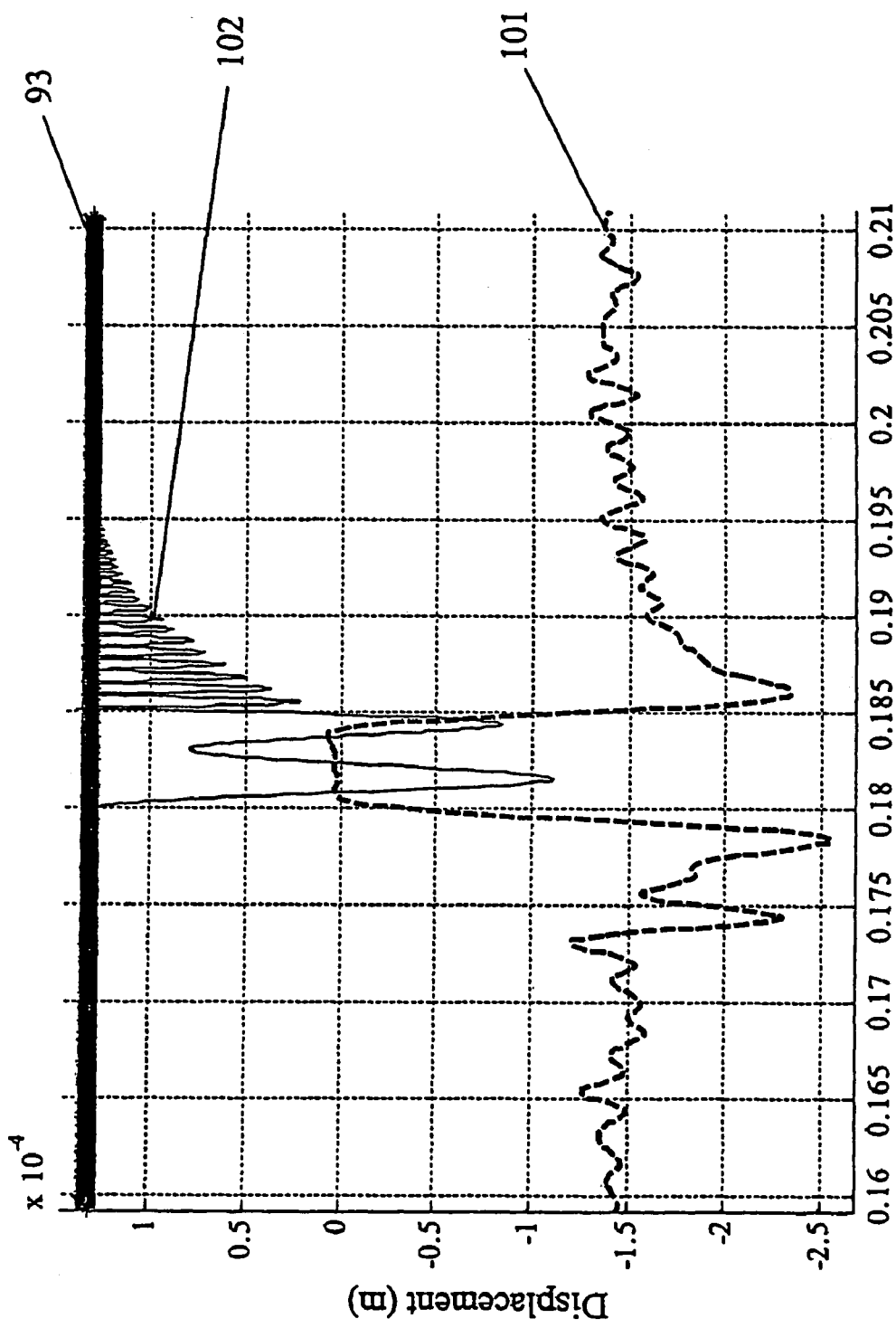
FIG. 11 is an enlarged view of a portion of FIG. 10.

A similar result is shown by FIGS. 9, 10 and 11, that show the result of a simulation performed by the Applicant with a conventional computer simulation tool. In the simulation, a model representing the cantilever-fashion piezoelectric power supply described above with reference to FIGS. 7 and 6, disposed on the inner surface of a tyre, was considered. Acceleration profiles corresponding to actual radial acceleration signals taken from measurement performed at different rotation speeds with an accelerometer located on the inner surface of a tyre, were considered as the accelerations exciting the power supply.

With reference to FIG. 9, curve 91 represents a portion of the acceleration profile versus time used for the simulation, taken at a speed of 40 km/h. Curve 92 represents the calculated displacement versus time experienced by the center of mass of the piezoelectric element+loading mass structure. Straight line 93 represents the maximum allowed displacement in one direction, i.e. a half of the gap. The values reported in the y-axis of FIG. 9 refer to displacement values, and are to be considered as arbitrary units for the acceleration curve 91. As it can be seen by curve 92, continued oscillations are performed by the piezoelectric plate associated to the loading mass, around a second equilibrium position displaced from the first equilibrium position represented by the ordinate value "0", i.e. the equilibrium position taken by the piezoelectric plate when the tyre is stationary. The second equilibrium position is reached by the center of mass being subject to the centrifugal acceleration developed during rotation. FIG. 9 shows both oscillations of smaller entity and oscillations of higher entity. The oscillations of higher entity correspond to the passage of the tread area corresponding to the tyre portion associated to the power supply under the contact patch, i.e. where the curve 91 reaches a substantially zero value. The oscillations of smaller entity are practically present and superimposed all over curve 92. It has also to be noticed that during the higher entity oscillations the center of mass "hits" the straight line 93, corresponding to actual hitting of the loading mass against the inner walls of the power supply housing.

With reference to FIG. 10, curve 101 represents a portion of the acceleration profile versus time used for the simulation, taken at a speed of 80 km/h. Curve 102 represents the calculated displacement versus time experienced by the center of mass of the piezoelectric element+loading mass structure. Straight line 93 still represents the maximum allowed displacement in one direction, i.e. a half of the gap. The values reported in the y-axis of FIG. 10 refer to displacement values, and are to be considered as arbitrary units for the acceleration curve 101. As it can be seen by curve 102, pulsed oscillations are performed by the piezoelectric plate associated to the loading mass, starting from the maximum allowed displacement, at the passage of tread area corresponding to the tyre portion associated to the power supply under the contact patch, i.e. where the curve 101 reaches a substantially zero value. FIG. 11 shows an enlarged portion of FIG. 10. As it can be seen in FIG. 11, curve 102 is initially superimposed to line 93, corresponding to a positioning of the loading mass against the inner walls of the housing. When the radial acceleration (curve 101) decreases, the loading mass begins free oscillation around the first equilibrium position (zero ordinate value in FIG. 11), as represented by the strong oscillation of curve 102 in the central portion of FIG. 11. When the radial acceleration increases, the loading is urged against the inner walls of the housing, that completes after a series of hits against the inner walls of the housing, as represented by the damped oscillations of curve 102 in the right portion of FIG. 11.

Figure 12:
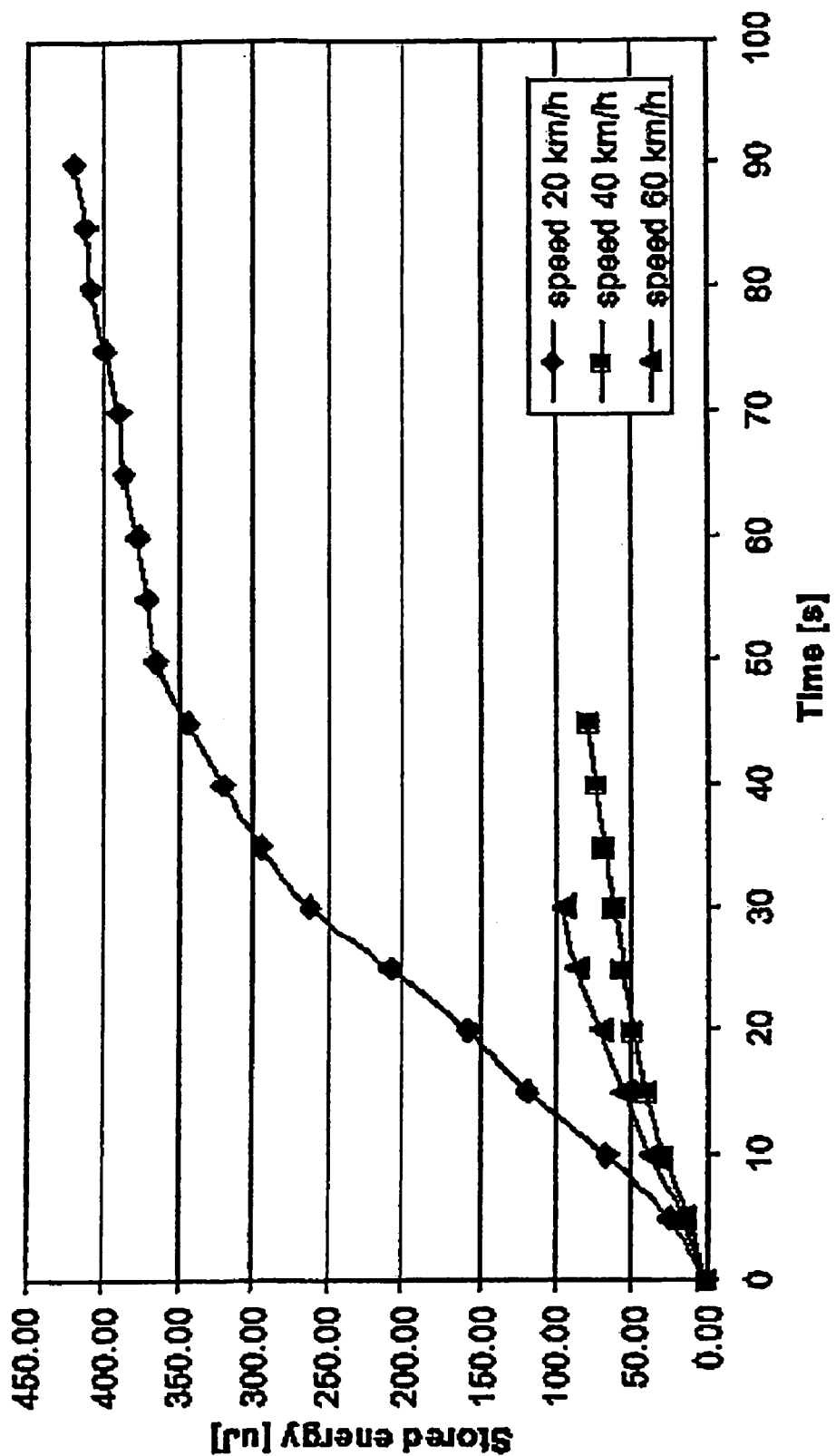
FIG. 12 shows three curves of stored electrical energy versus time obtained in a test with a flexing piezoelectric element such as that shown in FIG. 3a, 3b.

The Applicant has verified that a power supply prepared as shown in FIG. 3a, 3b, associated to a tyre portion in correspondence of a tread area, as explained above, with the different components (piezoelectric element material, dimensions, number of piezoelectric layers, loading mass value, gap) sized so as to obtain a substantially continuous generation of electric charge when the tyre rotates at low speed and a substantially pulsed generation of electric charge when the tyre rotates at high speed, allows to obtain a sufficient electrical power for supplying common sensor devices to be included within a tyre for a monitoring of its characteristic parameters. In particular, a high quantity of electrical charge can be generated at low speed, due to substantially continuous oscillation of the piezoelectric element. This is shown by the graph of FIG. 12, in which three curves obtained in a series of tests performed by the Applicant are represented. The three curves of FIG. 12 show the electrical energy stored in a capacitor of 100 µF connected (via a rectifier diode bridge) to the exemplary power supply described above with reference to FIGS. 7 and 8, versus time. A load resistance of 3.3 MΩ was connected across the capacitor. The power supply was disposed on a shaker device to which actual acceleration signals obtained from a tyre rotating at a speed of 20 km/h, 40 km/h, 60 km/h were applied. As it can be seen, a higher quantity of electrical energy is stored within the capacitor at a speed of 20 km/h in a given time interval, with respect to that stored at 40 or 60 km/h in the same time interval. Furthermore, a higher quantity of electrical energy is stored in a given time interval at a speed of 60 km/h, with respect to that stored at 40 km/h, since the frequency of the pulsed electric charge generations is higher at 60 km/h.

A great reliability of the power supply has been also verified by the Applicant. The Applicant believes that this depends on the fact that at low speed the piezoelectric element is excited to oscillate to a small extent for the majority of time, whereas large oscillations occurring when the tyre portion associated to the power supply passes under the contact patch may be limited with a suitable dimensioning of the gap between the inner walls of the housing and the outer surface of the loading mass. Thus, a strong reduction of the occurrence of cracks and breakings within the piezoelectric material may be obtained. The precise speed value at which the behavior of the power supply passes from "continuous generation of electric charge" to "pulsed generation of electric charge" depends on the precise dimensioning of the components forming the power supply. Advantageously, the dimensioning of the various components may be performed to obtain a behavior change of the power supply between intermediate speeds, preferably comprised between 30 km/h and 70 km/h, more preferably between 40 km/h and 60 km/h. Advantageously, in order to reduce the occurrence of resonant modes of the power supply, the various components of the power supply may be dimensioned so as to obtain a resonance frequency of the piezoelectric element+loading mass structure higher than 150 Hz, preferably higher than 200 Hz, more preferably higher than 300 Hz. The Applicant believes that such choice allows to further increase the reliability of the power supply, since large resonant oscillations of the piezoelectric element are substantially avoided during tyre rotation, in any practical speed condition.

Exemplary preferred ranges for a power supply using a bimorph PZT piezoelectric plate for obtaining the above explained performance may be the following:

length of the PZT plate: from 8 to 18 mm;
width of the PZT plate: from 3 to 18 mm;
overall thickness of the bimorph plate: from 0.30 to 1.20 mm;
loading mass: from 0.05 gr to 3 gr
gap: from 50 to 400 µm.

With particular reference to the loading mass size, it has to be noticed that a low size of the loading mass allows to increase the resonance frequency of the piezoelectric element+loading mass structure. Furthermore, a low size of the loading mass allows to reduce unbalancing caused to the tyre rotation due to the presence of the power supply. Moreover, a low size of the loading mess allows to reduce the occurrence of cracks and breakings in the power supply housings caused by the hits against the inner walls during oscillation. However, a too low size of the loading mass does not allow sufficient bending of the piezoelectric element, with consequent insufficient generation of electrical charge. A guideline for the dimensioning of the power supply could be to choose a loading mass size m sufficient to substantially avoid unbalancing of the tyre during rotation (e.g. a mass lower than 3 gr.), to choose a resonance frequency $f_r$ for the piezoelectric element+loading mass structure (e.g. higher than 150 Hz) and then derive the dimensions of the piezoelectric element from its stiffness k, calculated by inverting the following well known relationship:

$$f_r = \frac{1}{2\pi}\sqrt{\frac{k}{m}}$$

The invention claimed is:

1. A method for generating electrical energy within a tyre, comprising:
    associating a housing including a piezoelectric element with a tyre portion in correspondence with a tyre tread area, the piezoelectric element being disposed substantially along a plane orthogonal to a radial direction of said tyre and having a first end substantially fixed to said housing and a second end fixed to a loading mass, a gap being formed between at least one inner wall of said housing and an outer surface of said loading mass;
    rotating said tyre on a rolling surface at a first rotation speed lower than a given speed, so as to cause said loading mass to oscillate within said gap, thereby leading to a first deformation of said piezoelectric element during said tyre rotation;
    rotating said tyre on said rolling surface at a second rotation speed higher than said given speed, so as to cause said loading mass to contact said inner wall during a first fraction of a complete tyre revolution, during said first fraction said tread area corresponding to said tyre portion being not in contact with the rolling surface, and to cause said loading mass to oscillate within said gap during a second fraction of a complete tyre revolution, during said second fraction said tread area corresponding to said tyre portion being in contact with the rolling surface, thereby leading to a second deformation of said piezoelectric element during said tyre rotation; and
    collecting electrical energy generated from said first and said second deformations of said piezoelectric element.

2. The method according to claim 1, wherein said tyre portion is a portion of an inner surface of the tyre.

3. The method according to claim 1, wherein the piezoelectric element has a longer side disposed substantially according to an axial direction of the tyre.

4. The method according to claim 1, wherein during said rotation at said second rotation speed, said loading mass oscillates around a first equilibrium position, substantially disposed along said plane orthogonal to said radial direction of the tyre.

5. The method according to claim 4, wherein during said rotation at said first rotation speed, said loading mass oscillates around a second equilibrium position within said gap, different from said first equilibrium position.

6. The method according to claim 1, wherein said given speed is 30 km/h to 70 km/h.

7. The method according to claim 6, wherein said given speed is 40 km/h to 60 km/h.

8. A system for generating electrical energy comprising:
a tyre; and
a power supply comprising a piezoelectric element, associated with a tyre portion in correspondence with a tyre tread area; wherein
said piezoelectric element is disposed within a housing so as to have a first end substantially fixed to said housing and a second end associated with a loading mass, a gap being formed between at least one inner wall of said housing and an outer surface of said loading mass;
said piezoelectric element is positioned substantially along a plane orthogonal to a radial direction of said tyre;
said piezoelectric element, said loading mass and said gap are sized so as to obtain:
a) during rotation of the tyre on a rolling surface at a first rotation speed lower than a given speed, an oscillation within said gap of said loading mass associated with said piezoelectric element; and
b) during rotation of the tyre on said rolling surface at a second rotation speed higher than said given speed, a contact of said loading mass with said inner wall of said housing during a first fraction of a complete tyre revolution, during said first fraction said tread area corresponding to said tyre portion being not in contact with said rolling surface, and an oscillation within said gap of said loading mass associated with said piezoelectric element during a second fraction of a complete tyre revolution, during said second fraction said tread area corresponding to said tyre portion being in contact with the rolling surface.

9. The system according to claim 8, wherein said tyre portion is a portion of an inner surface of the tyre.

10. The system according to claim 8, wherein the piezoelectric element has a longer side disposed substantially according to an axial direction of the tyre.

11. The system according to claim 8, wherein said given speed is 30 km/h to 70 km/h.

12. The system according to claim 11, wherein said given speed is 40 km/h to 60 km/h.

13. The system according to claim 8, wherein a resonance frequency of said piezoelectric element associated with said loading mass within said housing is higher than 150 Hz.

14. The system according to claim 13, wherein said resonance frequency is higher than 200 Hz.

15. The system according to claim 14, wherein said resonance frequency is higher than 300 Hz.

16. The system according to claim 8, wherein said loading mass is lower than 3 gr.

17. The system according to claim 8, wherein said loading mass is U-shaped.

18. The system according to claim 8, wherein said gap has a maximum extent of 400 μm.

19. The system according to claim 8, wherein said piezoelectric element is a bimorph element.

20. The system according to claim 8, wherein said piezoelectric element is a planar element.

21. The system according to claim 8, wherein said piezoelectric element comprises PZT.

22. A system for monitoring at least one operating parameter of a tyre comprising:
a system for generating electrical energy including a power supply according to claim 8;
a sensor device comprising a measurement device adapted to measure said at least one operating parameter and a transmitter device adapted to transmit said measured parameter, associated with said power supply; and
a receiving device adapted to receive said transmitted measured parameter.

23. The system according to claim 22, wherein said measurement device comprises a pressure sensor.

24. The system according to claim 22, wherein said measurement device comprises a temperature sensor.

25. The system according to claim 22, wherein said measurement device comprises an acceleration sensor.

26. The system according to claim 22, wherein said measurement device comprises a counter of tyre revolutions.

27. The system according claim 22, wherein said sensor device comprises a microcontroller adapted for and capable of enabling said measurement device and said transmitter device, associated with said power supply.

* * * * *